United States Patent [19]
Agarde

[11] 3,915,307
[45] Oct. 28, 1975

[54] HOLDER FOR PRINTED CIRCUIT BOARDS

[75] Inventor: Rune Agarde, Linkoping, Sweden

[73] Assignee: Saab Scania Aktiebolag, Linkoping, Sweden

[22] Filed: May 30, 1974

[21] Appl. No.: 474,306

[52] U.S. Cl. ............ 211/41; 206/328; 317/101 DH; 339/17 M
[51] Int. Cl.[2] ...................... B65D 85/46; H02B 1/02
[58] Field of Search ............ 206/328, 449, 454, 73; 211/41; 317/101 DH; 339/17 M, 17 LM

[56] References Cited

UNITED STATES PATENTS

| | | | |
|---|---|---|---|
| 3,016,148 | 1/1962 | Riddle | 211/41 |
| 3,184,069 | 5/1965 | Rosenberg | 211/41 |
| 3,247,424 | 4/1966 | Kossoy et al. | 211/41 W X |
| 3,349,924 | 10/1967 | Maurer et al. | 211/41 |
| 3,511,385 | 5/1970 | Ayling | 211/41 |
| 3,810,433 | 5/1974 | Posner | 211/41 |

*Primary Examiner*—William T. Dixson, Jr.

[57] ABSTRACT

An elongated rail member, defining at a front side thereof a groove in which an edge portion of a printed circuit board is receivable, is secured to a wall member by means of a pair of cylindrical studs that project obliquely rearwardly from its rear side, one near each end, and which are inclined rearwardly away from one another. The studs are received in conical outwardly divergent holes in the wall member. The rail member is resiliently bowable to enable the studs to be inserted into the holes.

4 Claims, 6 Drawing Figures

HOLDER FOR PRINTED CIRCUIT BOARDS

The present invention relates to a holder for printed circuit boards equipped whith electrical components, which holder comprises elastically flexible guide rails mounted in pairs on a box-like framework to provide exactly opposite longitudinal tracks into which the printed circuit boards can be inserted and in inserted condition can be connected to a contact arrangement.

Electrical equipment, for example for control and adjustment, is now built up to a large extent of exchangeable printed circuit boards which are held in position by guide rails in the abovementioned manner. The advantage of such a setup is that the equipment will be easy to service and that faults can quickly be remedied by the exchange of faulty printed circuit boards, on which a search for the fault can be carried out without pressure of time and frequently with the help of qualified testing equipment which cannot be carried along to the location of the equipment when it is in operation.

The guide rails which hold the printed circuit boards in position are often riveted or screwed tightly to the framework. Such securement requires several manual operations and is therefore expensive. It has also been suggested to make the guide rails of an elastic material and provide them with elastic connecting elements which are adapted to permit a displacement of the printed circuit in relation to the framework. This, however, implies a relatively large, space-requiring, complicated and therefore expensive construction.

It is the object of the present invention to provide a simple and therefore cheap holder of the type mentioned, which is space-saving and permits the fixing of the guide rails to the framework in a manner that creates no projections on the flat outside surface of the framework and this is achieved in that each of the guide rails is provided with studs on its side opposite its track, near its ends, which studs slope outwards from one another; and that the framework has holes that taper towards the rails and are so spaced from one another that the studs, when the rail is given a curvelike deflection, can be inserted into the holes and the rail is retained by the studs when it straightens out.

Figure 1:
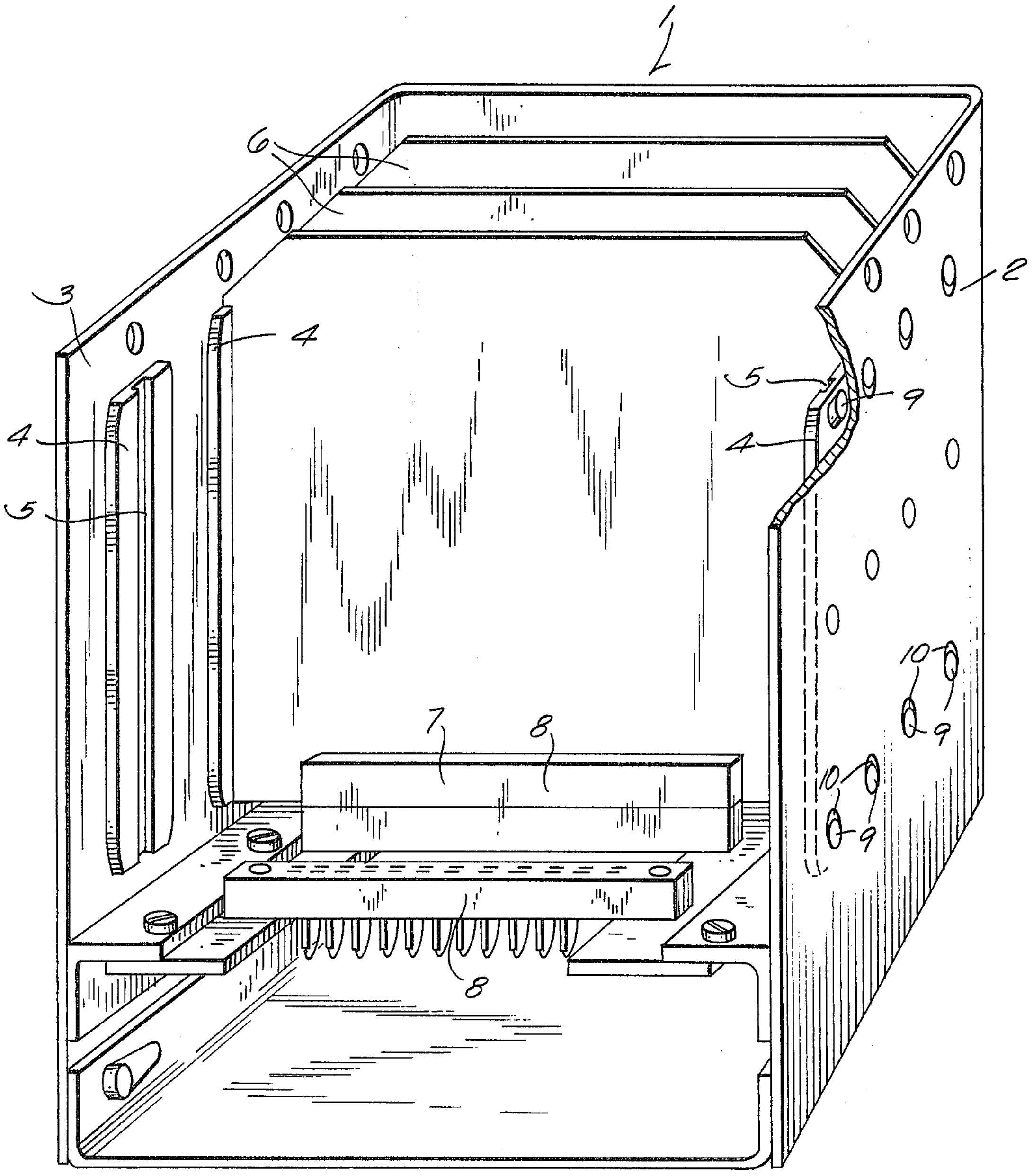
Figure 2A:
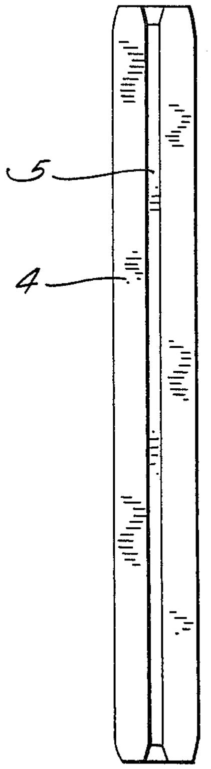
Figure 2B:
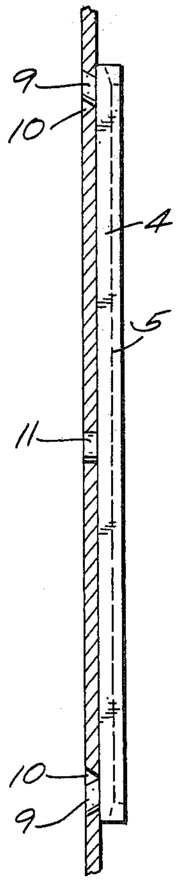
Figure 2C:
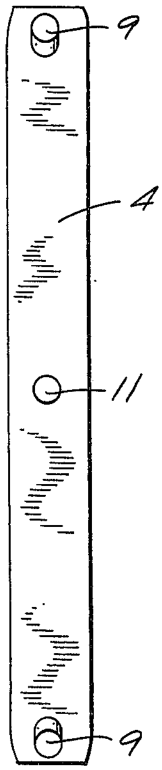
Figure 2D:
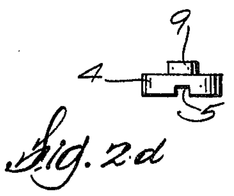

In the following description the invention will be explained in greater detail with reference to the enclosed drawing in which FIG. 1 is a perspective view of a holder for printed circuits in accordance with the invention, FIG. 2*a* is a plan view of a rail member as seen from its front or inner side;

FIG. 2*b* is a side view of the rail member as mounted on a wall member according to the principles of this invention, the wall member being shown in section;

FIG. 2*c* is a plan view of the rear side of the rail member;

FIG. 2*d* is an end view of the rail member; and

Figure 3:
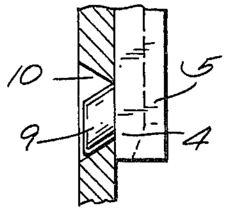

FIG. 3 is a detail view on an enlarged scale showing how the rail is retained in the framework by sloping studs.

In the drawing, numeral 1 refers to a box-like chassis frame having upright side walls 2, 3, on the opposing inner surfaces of which are mounted elastically flexible guide rails 4. The guide rails 4 have inner sides that define longitudinal tracks 5, and they are situated exactly opposite one another to cooperate in slidingly receiving printed circuit boards 6 equipped with electrical components. For each printed circuit board there is a contact arrangement comprising a male part 7 that is connected to the respective printed circuit board and a female part 8 that is fixed to the framework, so that contact is obtained when the printed circuit has been fully inserted in the framework. Via the contact arrangements, connection is achieved internally between the printed circuit boards 6 and between the latter and external apparatus (not shown) for which the electrical equipment is intended.

In accordance with the invention, each guide rail 4 is provided at its side opposite the track 5, with a pair of studs 9 one near each of its ends, which slope outwards from one another, as can be seen from FIGS. 2*b*, *c* and FIG. 3. In the framework 1 are provided conical holes 10 which taper towards the guide rails 4. The distance between two holes 10 intended for one rail 4 is such that when the rail 4 is deflected into a curve, the studs 9 can be introduced into the holes 10. When the guide rail straightens out, the guide rail 4 is retained by the studs 9. The tapering hole may be made, for example, by means of a countersink.

In accordance with a special characteristic of the invention, each of the guide rails 4 is also provided, on the side on which are the oblique studs, with a straight guiding stud 11 which fits into a corresponding hole in the framework 1. It is the object of the guiding stud 11 to prevent, especially in the case of long guide rails, any movement of the guide rail in the plane of the side walls 2, 3, for example as a result of vibrations.

The invention must not be regarded as limited to the embodiment described above. On the contrary, it can be varied in many ways within the scope of the concept of the invention with regard, inter alia, to the choice of elastic material of which the rails are manufactured. If for example the guide rails are manufactured of extruded sheets, the studs may be constituted of tongues extruded from the sheet.

I claim:

1. Structure comprising a wall member with substantially flat inner and outer surfaces and an elongated rail member that has opposite front and rear sides, portions of the rear side of the rail member being disposed in a common plane so that the rail member can flatwise overlie the inner surface of the wall member, and the front side of the rail member being formed to define a lengthwise extending forwardly opening groove in which an edge portion of a printed circuit board or the like is slidingly receivable, said structure being characterized by:

A. the rail member having a pair of studs projecting rearwardly from its rear side, one near each end thereof, each of substantially circular cross-section,
   1. each of said studs having its axis lying substantially in a plane which extends lengthwise of the rail member and which is perpendicular to said common plane, and
   2. each of said studs having its axis oblique to said common plane, each being inclined rearwardly and towards its adjacent end of the rail member so that said studs project obliquely away from one another;

B. the wall member having a pair of conical holes therein, each of which diverges towards its outer surface, said holes being spaced apart by a distance to receive said studs and to cooperate with the studs in securing the rail member to the wall member; and C. the rail member being temporarily deformable so that it can be bowed along its length to permit insertion of said studs into said holes.

2. The structure of claim 1, further characterized by:

1. the rail member having another stud projecting rearwardly from its rear side, intermediate said pair of studs, which other stud has its axis perpendicular to said common plane; and
2. the wall member having a hole intermediate said pair of conical holes and in which said other stud is received with a close fit.

3. Structure comprising a wall member with substantially flat inner and outer surfaces, and an elongated rail member having a flat rear side that can overlie the inner surface of the wall member and having an opposite front side that defines a forwardly opening lengthwise extending groove in which an edge portion of a printed circuit board or the like is slidingly receivable, said structure being characterized by:

A. the rail member having a pair of substantially cylindrical studs projecting rearwardly from its rear side, one near each end thereof;

B. said studs having their axes at such opposite inclinations to the length of the rail member that they are inclined rearwardly away from one another and towards their respective adjacent ends of the rail member;

C. the wall member having a pair of conical holes therein, each of which diverges towards its outer surface, 1. said holes, at their inner ends, being substantially equal in diameter to the diameters of said studs, and
2. said holes being spaced apart by a distance equal to the distance between the studs at their junctions with the flat rear side of the rail member; and D. the rail member being temporarily deformable along its length to permit it to be bowed for insertion of said studs into said holes.

4. The structure of claim 3, further characterized by:

1. the rail member having another cylindrical stud projecting rearwardly from its rear side, intermediate said pair of studs, and which has its axis normal to the flat rear side of the rail member; and
2. the wall member having a cylindrical hole between said conical holes and in which the last-mentioned stud is received with a substantially close fit.

* * * * *